TEMPERATURE STABILIZED SEMICONDUCTOR DEVICES

Filed June 28, 1965 4 Sheets-Sheet 1

INVENTORS:
STEPHEN P. EMMONS
WALTER T. MATZEN
ROBERT A. MEADOWS
HILTON W. SPENCE

E. Mickey Hubbard
ATTORNEY

United States Patent Office 3,383,614
Patented May 14, 1968

3,383,614

TEMPERATURE STABILIZED SEMICONDUCTOR DEVICES

Stephan P. Emmons and Walter T. Matzen, Richardson, Robert A. Meadows, Dallas, and Hilton W. Spence, Richardson, Tex., assignors to Texas Instruments Incorporated, Dallas, Tex., a corporation of Delaware Filed June 28, 1965, Ser. No. 467,320
20 Claims. (Cl. 330—23)

ABSTRACT OF THE DISCLOSURE

Disclosed is a temperature stabilized semiconductor device which is thermally insulated from the ambient, said device including a heat source and a heat sensor, which are ranged to sense the average temperature on the substrate for maintaining the substrate at a substantially constant temperature.

This invention relates to temperature stabilized semiconductor devices, and more particularly, but not by way of limitation, relates to a temperature stabilized substrate and a direct coupled differential amplifier having a very low drift over a wide range of ambient temperatures.

Some of the principal causes of drift in semiconductor devices or networks are the changes in the voltage drops across and currents through various PN junctions in diodes and transistors. For example, simple direct coupled transistor amplifiers are not practical for many applications because the change in base-emitter voltage and base current with temperature produces too much drift over the normal range of ambient temperatures. The drift problem can be reduced by using differential amplifier configurations, and theoretically can be eliminated by this type of circuit if the base-emitter voltages of the transistor pairs are perfectly matched and if the transistors are always maintained at precisely the same temperature. In practice, however, it is impossible to effect either of these conditions. Differences in the base-emitter voltages are sometimes compensated by such circuit modifications as adjusting resistor values in the networks so as to equalize the $V_{BE}$ values of the transistor pair to the same value. However, these measures to eliminate drift destroy the common mode rejection capability of the differential pair unless further compensating circuits are introduced to recover the common mode rejection, which results in a complex overall circuit in which drift can be tuned out only by trial and error adjustments. Drift has also been compensated by placing the matched differential pair in a constant temperature oven. This requires relatively expensive equipment and the dispensing of substantial amounts of power in order to maintain a constant temperature within the oven.

The thermal characteristics of semiconductor substrates have also been used for various operational and stabilization functions and it has heretofore been suggested that a substrate be maintained at a constant temperature by a heating source and thermostatic means incorporated in the substrate so as to provide a temperature stabilized substrate.

This invention is concerned with an improved temperature stabilized substrate for maintaining a control region on a solid substrate within a preselected temperature range so that one or more semiconductor devices in heat transfer with the control region will be temperature stabilized. More specifically, the invention is concerned with the temperature gradients within the substrate as a result of the addition of heat and the flow of heat to the ambient and in the control of the temperature gradients in such a manner as to maintain a single component, such as a reference diode, within a preselected absolute temperature range, or to maintain two or more components, such as a matched pair of transistors, in a predetermined temperature relationship over a predetermined temperature range so as to compensate for differences in temperature characteristics in the two transistors, or for the temperature characteristics of other components in the circuit.

In accordance with a preferred embodiment of this invention, this is accomplished by fabricating the substrate, its insulation from the ambient, and the components on the substrate in such a manner as to establish a controlled temperature gradient pattern over the substrate as a result of the introduction of heat to the substrate by a heater located on the substrate. A plurality of sensors are positioned at the other end of the substrate and arrayed so as to determine an effective center of sensing within a control region adjacent the end of the substrate and on the axis of symmetry of the temperature gradient pattern and to sample the temperature within the control region. The sensors and heater are part of an electrical amplifier which produces a negative thermal feedback and maintains the average temperature of the control region within a given temperature range for a given ambient temperature range, thereby providing a high gain negative feedback loop to temperature inputs, i.e., ambient temperature, and temperature output, i.e. substrate temperature.

In accordance with another aspect of the invention, one sensor samples the temperature in close proximity to the heater so as to act as an anticipator and prevent oscillation of the thermal amplifier system.

In accordance with another very important aspect of the invention, a symmetrical temperature gradient pattern is purposely distorted in order to establish a temperature gradient between two or more components to compensate for different temperature characteristics of the device or to compensate for anomalies in the substrate or in the insulation around the substrate, or any other desired purpose.

The invention specifically contemplates a temperature stabilized diode fabricated in a separate semiconductor slice, and also a high gain, direct coupled, differential preamplifier having a very low drift, i.e., on the order of 10 microvolts over the temperature range from 0° C. to 100° C., referred to the input.

The novel features believed characteristic of this invention are set forth in the appended claims. The invention itself, however, as well as other objects and advantages thereof, will best be understood by reference to the following detailed description of illustrative embodiments, when read in conjunction with the accompanying drawings, wherein:

Figure 1:
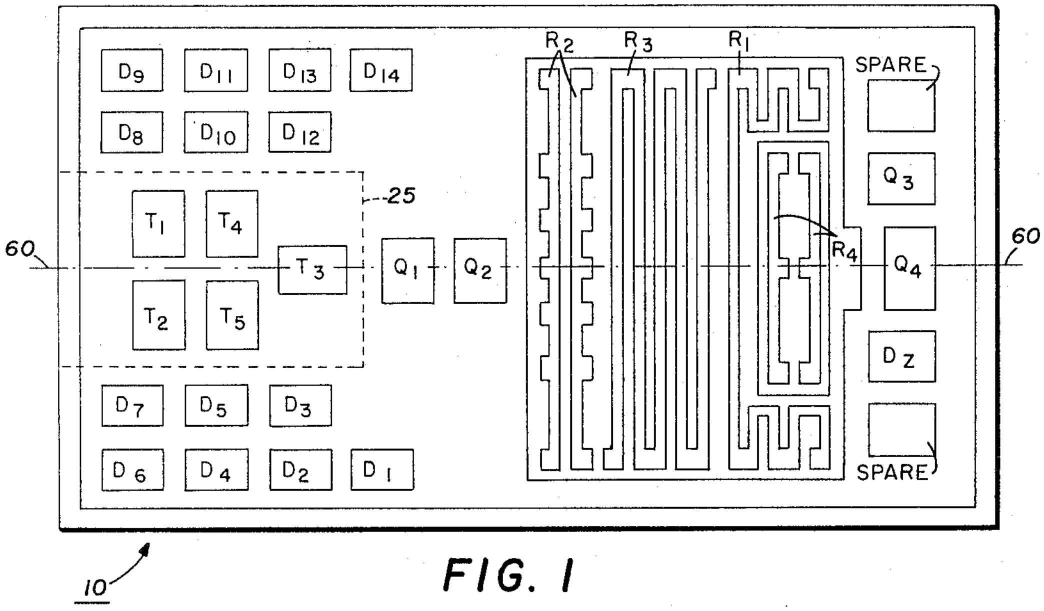
FIGURE 1 is a plan view of a temperature stabilized substrate fabricated in accordance with the present invention.

Referring now to the drawings, the prototype embodiment of a temperature stabilized substrate constructed in accordance with the present invention is indicated generally by the reference numeral 10. The substrate 10 in the embodiment illustrated is silicon, but may be fabricated from any suitable conventional solid material compatible with the fabrication of semiconductor devices. In most cases, the substrate will be a semiconductor material in which semiconductor components may be fabricated by various techniques. Such a material is a good thermal conductor. The various active and passive components for the circuits which will presently be described are illustrated only in outline so as to illustrate the location of the respective components on the substrate. In general, the small rectangular areas are transistors, some of which have been shunted from collector to base to form diodes, while the elongated, irregularly shaped areas are resistors. The amplifier circuit shown in FIGURE 2, and indicated generally by the reference numeral 12, is included in its entirety on the substrate 10. Only the transistors of the preamplifier shown in the schematic of FIGURE 3 to the left of the dotted line 14, and indicated generally by the reference numeral 16 are included on the substrate 10. The substrate 10 is disposed within a standard fourteen lead integrated network flat pack 20 and is mounted on the bottom 22 of the flat pack by an insulating layer 24 which will hereafter be described in greater detail. The various resistors in the preamplifier circuit 16 were, for convenience in the prototype unit, thin film resistors contained in a separate package. The differential amplifier stage 18 shown to the right of the dotted line 14 in FIGURE 3, and indicated generally by the reference numeral 18 is an off-the-shelf amplifier manufactured and sold by the assignee of this invention and is contained in a separate standard package.

Figure 2:
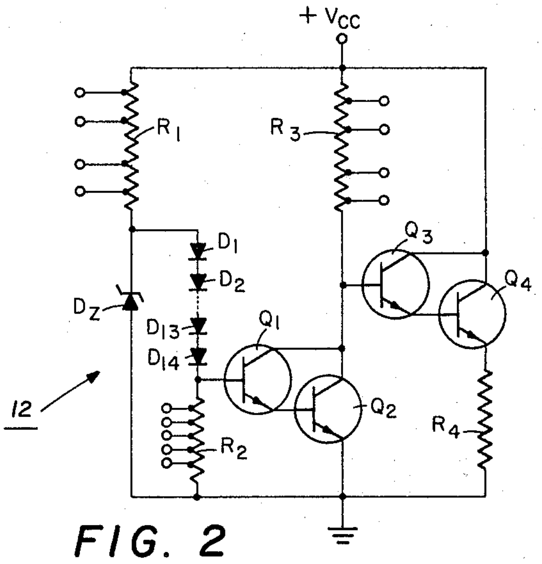
FIGURE 2 is a schematic diagram of the electrical circuit incorporated in the substrate of FIGURE 1.

Referring now in detail to FIGURE 2, the circuit 12 is a D.C. amplifier the input of which is the voltage change across the sensor junctions as a result of changes in the temperature of the substrate 10 within a control region 25 indicated generally in dotted outline, and the ouput of which is the power dissipated in the substrate. The circuit 12 and thermal coupling between the heater and sensor acts as a negative feedback to ambient temperature inputs to the substrate as will hereafter become more evident. A voltage divider, comprised of a resistor $R_1$ and a Zener diode $D_z$, is connected between the positive voltage source $V_{cc}$ and ground. A second voltage divider, comprised of fourteen forward biased diodes $D_1$–$D_{14}$, only four of which are illustratedd in FIGURE 2, and a resistor $R_2$, is connected across diode $D_z$. The diodes $D_1$–$D_{14}$ and $D_z$ perform the sensing function as will hereafter be described. The base of transistor $Q_1$ is connected to the center of the second voltage divider and the emitter is connected to the base of transistor $Q_2$. The collectors of transistors $Q_1$ and $Q_2$ are common and are connected through resistor $R_3$ to the collector supply. The emitter of transistor $Q_2$ is connected to ground. The base of transistor $Q_3$ is tied to to the collectors of transistors $Q_1$ and $Q_2$. The collector of transistor $Q_3$ is common to the collector of transistor $Q_4$ and both are tied to the collector voltage supply. The emitter of transistor $Q_3$ is connected to the base of transistor $Q_4$ and the emitter of transistor $Q_4$ is connected through a resistor $R_4$ to ground. Transistor $Q_4$ dissipates power as a result of current through the collector-emitter circuit that is used to heat the substrate 10 as will presently be described. Thus the diodes $D_z$ and $D_1$–$D_{14}$ serve as temperature sensors and the input of the amplifier, the transistor $Q_4$ serves as the heater and the output, and the electrical circuit and thermal coupling of the substrate perform a negative feedback function as will presently be described.

Figure 3:
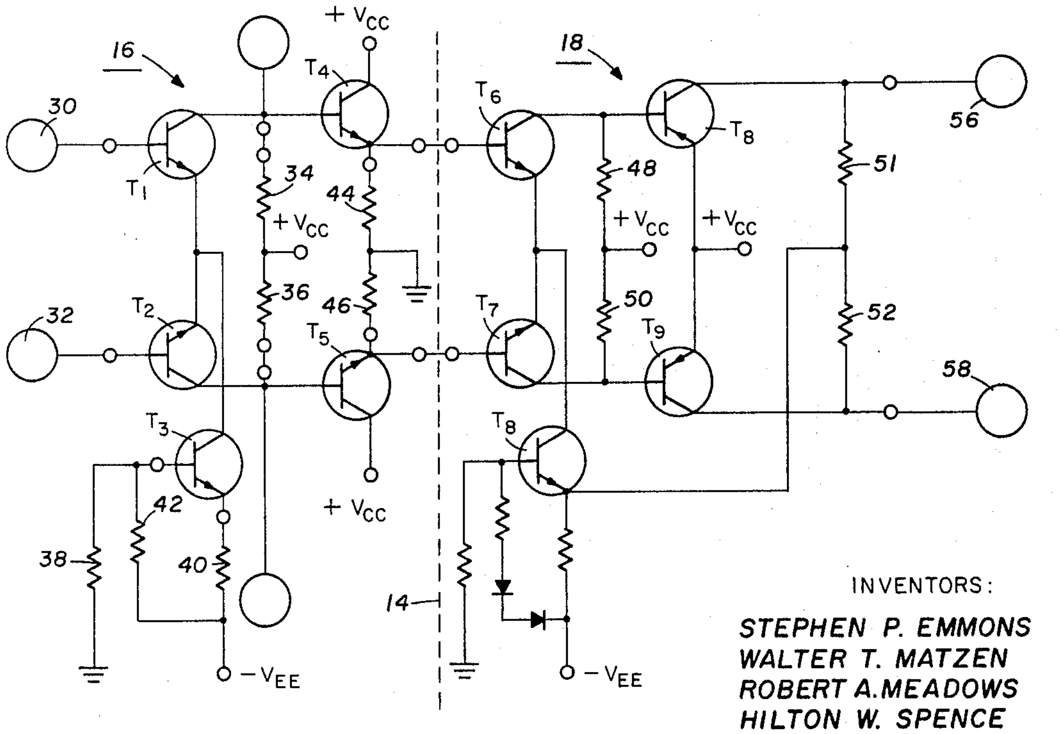
FIGURE 3 is a schematic circuit diagram of a direct coupled, differential pair preamplifier and amplifier, a portion of which is incorporated in the substrate of FIGURE 1.

Referring now to FIGURE 3, the preamplifier 16 is comprised of a matched pair of input transistors $T_1$ and $T_2$, the bases of which serve as differential inputs 30 and 32. The collectors of transistors $T_1$ and $T_2$ are connected through matched resistors 34 and 36 to the positive voltage supply, and the emitters are connected to the collector of a transistor $T_3$. The base of transistor $T_3$ is connected through a resistor 38 to ground and the emitter is connected through resistor 40 to a negative voltage supply. A resistor 42 interconnects the base and emitter of transistor $T_3$. Thus it will be noted that transistor $T_3$ is connected so as to provide a constant emitter current for the matched input transistors $T_1$ and $T_2$. The collectors of transistors $T_1$ and $T_2$ serve as the differential output from the first stage of the preamplifier and are connected to the bases of transistors $T_4$ and $T_5$. The transistors $T_4$ and $T_5$ are connected in emitter-follower configuration, the collectors being connected to a positive voltage supply and the emitters being connected to ground through matched resistors 44 and 46. The emitters of transistors $T_4$ and $T_5$ are the outputs of the preamplifier 16 and are connected to the bases of input transistor pair $T_6$ and $T_7$ of the differential amplifier 18. The amplifier 18 has a transistor $T_8$ which provides a constant emitter current for the input transistors $T_6$ and $T_7$, and a second amplifying stage comprised of a matched pair of transistors $T_8$ and $T_9$ which are biased through resistors 48, 50, 51 and 52. The collectors of transistors $T_8$ and $T_9$ are the outputs 56 and 58 of the amplifier.

Referring once again to FIGURE 1, it will be noted that all of the components of the amplifier 12 are formed in the substrate 10 at the locations indicated by the corresponding reference numerals. It will be noted that the substrate 10 is in the configuration of an elongated rectangle so as to have a longitudinal axis of symmetry indicated by the dotted line 60. The heater transistor $Q_4$ is located symmetrically about the axis of symmetry 60 and adjacent one end of the substrate 10. It will also be noted that the resistor $R_4$, through which the emitter current of transistor $Q_4$ must pass, is also disposed close to the transistor $Q_4$ and is essentially symmetrical about the axis 60, although the power dissipated in this resistor is small compared to that dissipated in transistor $Q_4$. Resistors $R_1$, $R_2$ and $R_3$ are also disposed symmetrically about the axis 60, although the power dissipated in these resistors is insignificant due to the very low currents. Transistor $Q_3$ is located on one side of the transistor $Q_4$ and the Zener diode $D_z$, which is actually a transistor of the same configuration in which the collector and base have been shorted, is disposed on the other side, thus providing a symmetrical configuration insofar as the thermal characteristics of the substrate are concerned. The Zener diode $D_z$ is located close to the heater transistor $Q_4$ primarily to serve as an anticipator sensor and prevent oscillation of the amplifier, as will hereafter be described. All of the other sensing elements, i.e., the diodes $D_1$–$D_{14}$, are disposed at the opposite end of the substrate 10. It will be noted that the diodes $D_1$–$D_{14}$ are also disposed symmetrically about the axis 60 and are also spaced transversely from and extend longitudinally of the axis 60 so as to sample the temperature of the substrate around the control region 25. The transistors $Q_1$ and $Q_2$, which also act as sensors to a small degree, are located on the axis 60.

The input pair of transistors $T_1$ and $T_2$ are located as close together as practical and symmetrically about the axis 60 and within the control region 25, and are preferably located close to the end of the substrate 10 opposite the heater $Q_4$ and within the control region 25. The second pair of transistors $T_4$ and $T_5$ of the preamplifier 16 are also located symmetrically about the axis 60 and placed as closely together as practical within the control region 25. Similarly, transistor $T_3$ is symmetrical to the axis 60 and located in the control region 25.

In order to understand the operation of the temperature stabilized substrate 10, assume first that the substrate is at an ambient temperature less than a preselected maximum. When the collector voltage $V_{cc}$ is applied, the base of transistor $Q_1$ is at a potential less than that required for conduction of the transistor $Q_1$ as a result of the total voltage drop across the sensing diodes $D_z$ and $D_1$–$D_{14}$ of the voltage divider network including resistors $R_1$ and $R_2$. Since there is essentially no emitter current in transistor $Q_1$, transistor $Q_2$ is also essentially at cutoff. As a result, substantially all of the current through resistor $R_3$, which incidentally remains essentially constant, is base current to transistor $Q_3$ and thus causes a large current in transistor $Q_4$. As a result, a relatively high current passes through the collector-emitter circuit of the power transistor $Q_4$ resulting in a dissipation of heat into the substrate 10 which propagates along the length of the substrate to the control region 25 and the surrounding sensing diodes $D_1$–$D_{14}$. As the temperature of the Zener diode $D_z$, which is disposed in close proximity to the power transistor $Q_4$, is heated, its reverse breakdown voltage increases thereby increasing the potential at the junction between the diode $D_z$ and the resistor $R_1$. On the other hand, the forward voltage drop across the diodes $D_1$–$D_{14}$ decreases as the temperature is raised so that the voltage at the base of transistor $Q_1$ increases. Also, the $V_{BE}$ of transistors $Q_1$ and $Q_2$ decreases as the temperature is raised. The combined effect of the raise in the reverse bias voltage of the Zener diode $D_z$, the lowering of the forward voltage drop across the diodes $D_1$–$D_{14}$, and the lowering of the $V_{BE}$ values for $Q_1$ and $Q_2$ results in an increase in the voltage applied to the base of transistor $Q_1$ since all of the changes are additive. As the current through the collector-emitter circuit of transistor $Q_2$ increases, the voltage at the base of transistor $Q_3$ is reduced, thereby reducing the current through the power transistor $Q_4$, which in turn reduces the power dissipated in the substrate. Thus when the temperature of the sensing end of the substrate reaches some temperature, equilibrium is established as a result of negative feedback from the sensors to the heater. Only enough heat is supplied by the transistor $Q_4$ to maintain the control region 25 of the substrate 10 essentially at a constant average temperature, except for the variations in temperature necessary to effect changes in the power dissipation. By making the gain of amplifier 12 high, this variation is reduced. If the ambient temperature then increases, the average temperature of the array of diodes $D_1$–$D_{14}$, and therefore of the control region 25, will increase an infinitesimal amount necessary to further restrict the current through the transistor $Q_4$ and decrease the power dissipated so as to maintain essentially the constant average temperature. Conversely, if the ambient temperature lowers, current through the transistor $Q_4$ will be raised to supply more heat and maintain the control region at essentially the same temperature.

Figure 5:
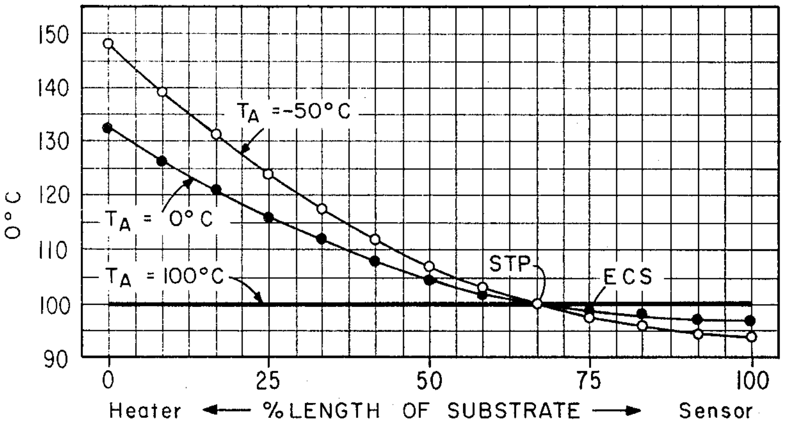
FIGURE 5 is a graph which serves to illustrate the operation of the temperature stabilized substrate of FIGURE 1.

It will be noted that the substrate 10 is mounted on the base plate 22 of the flat pack 20, which has a relatively high thermal conductance, by a hopefully homogeneous insulating layer 24, such as foam glass, which is fully coextensive with the substrate 10. Although the thermal conductivity of the insulating layer 24 is significantly less than that of the substrate 10, or that of the flat pack 20, the thermal conductance of the insulating layer 24 is nevertheles significantly greater than the thermal conductance of the small volume of trapped air within the package that surrounds the free face of the substrate, and the radiation, conduction and connection losses through the air are negligible and may be ignored for most purposes. In any event, it will be noted that all the thermal loss paths from the substrate 10 are symmetrical about the axis 60. As a result, the temperature generated at one end of the substrate by the heater transistor $Q_4$ propagates to the opposite end of the substrate 10 with thermal losses occurring through the insulation 24 along the entire length of the substrate. The flow of heat from the heater $Q_4$ through the substrate to the ambient establishes a thermal gradient along the length of the substrate 10 the slope of which is determined at any point by the characteristics of the thermal structure including the substrate and insulation, and by the ambient temperature, as represented by the graph of FIGURE 5. For example, assuming that the heater transistor $Q_4$ is turned off when the average temperature of the control region 25, which is essentially the average temperature of the diodes $D_1$–$D_{14}$, reaches 100° C., the slope of the temperature gradient along the substrate will be zero as indicated by the solid line in FIGURE 5. As the ambient temperature $T_a$ decreases, the average temperature of the sensing diodes lowers sufficiently to increase the power dissipated by the transistor $Q_4$. As a result, the heater end of the substrate increases above the 100° C. and the sensing end of the substrate falls below 100° C. Thus as illustrated by the curve $T_a$=0° in FIGURE 5, the heater end of the substrate might reach 132° C. when the ambient temperature is zero, while the sensing end of the substrate might fall to about 97° C. It will be noted that one point STP on the substrate between the point representative of the average temperature sensed and the heater remains stabilized at 100° C. When the ambient temperature $T_a$ is reduced to −50° C., the temperature at the heater end of the substrate may rise above 145° C. while the temperature falls below 95° at the sensing end of the substrate due to the increased heat flow through the insulating layer 24 along the length of the substrate. It is to be understood that FIGURE 5 is merely illustrative of the operation of the substrate and was compiled from an electrical model rather than from measurements made on the substrate.

From FIGURE 5 it will be appreciated that the effective center of sensing ECS must necessarily be on the opposite side of the stable temperature point STP from the heat source so as to obtain the ΔT input to the sensors of the amplifier 12 necessary to obtain the heat output from the heater $Q_4$. The extent to which the center of sensing ECS, which is representative of the average temperature in the control region 25, must fall below the temperature of the STP is determined by the gain of the amplifier. The gain of the amplifier is determined by the number of sensing diodes $D_1$–$D_{14}$ and $D_z$, as well as the amplification resulting from the transistor pairs $Q_1$–$Q_2$ and $Q_3$–$Q_4$. By using a large number of diodes $D_1$–$D_{14}$ as sensors, the gain of the amplifier is not only increased, but a means is provided for determining an effective center of sensing within the control region 25, and thus for determining the average temperature of the control region 25. Then if the gain of the amplifier 12 is designed so that the average temperature in the control region 25 has a maximum variation within acceptable limits for a given range of ambient temperatures, any semiconductor components located within the control region will be maintained substantially within the accepted limits. If the substrate, the heater and the insulation are symmetrical, the temperature gradient pattern on the substrate should also be symmetrical so that no temperature gradients should exist between any two points symmetrical to the axis 60. However, some temperature gradient will exist along the length of the axis 60, unless the insulation is modified, due to the flow of heat through the length of the substrate. As the ambient decreases and the heat flow increases, the temperature gradient between any two longitudinally spaced points will increase.

If a single semiconductor device, such as a reference diode is to be stabilized, it should not only be located within the control region, but should also be located at the stable temperature point STP in order to achieve the greatest possible temperature control. The stabilization of a single semiconductor component is relatively simple because it can be centered on the axis of symmetry 60 and transverse gradients are of no consequence. Then as long as it is located sufficiently close to the stable temperature point, the temperature of the device will not vary outside acceptable limits.

However, when a number of semiconductor devices are to be stabilized, the problem is complicated because of the temperature gradients which always exist longitudinally with respect to the substrate axis 60, and because of the temperature gradients which may exist transversely with respect to the substrate axis 60. For example, when transistor pairs of a differential amplifier are to be stabilized, a very slight difference in the temperature of the two transistors usually has a greater effect upon the drift of the amplifier than does a much greater change in the common temperature of the pair. The longitudinal temperature gradient can be compensated by locating the transistors symmetrically about the axis 60, assuming the temperature gradient patterns to also be symmetrical. The magnitude of any transverse gradient can be reduced by locating the transistors as close together as possible and at the point of minimum heat flow in the substrate. For this reason, the transistors should be located as near the end of the substrate as practical where heat flow is at a minimum. Even though the absolute temperature of the transistor pair may vary slightly more when located close to the end of the substrate than when located nearer the stable temperature point STP, the slight increase in the temperature range has less effect than much smaller differences in temperature between the transistors as a result of a temperature gradient. For these reasons, the input pair of transistors $T_1$ and $T_2$ are located adjacent the end of the substrate because drift in the $V_{BE}$ values of this pair has by far the greatest effect on the drift of the overall amplifier system. The emitter-follower pair of transistors $T_4$ and $T_5$ are disposed next to the input pair $T_1$–$T_2$. The constant current source transistor $T_3$, which is not a matched component, can be located approximately at the stable temperature point STP.

Figure 6:
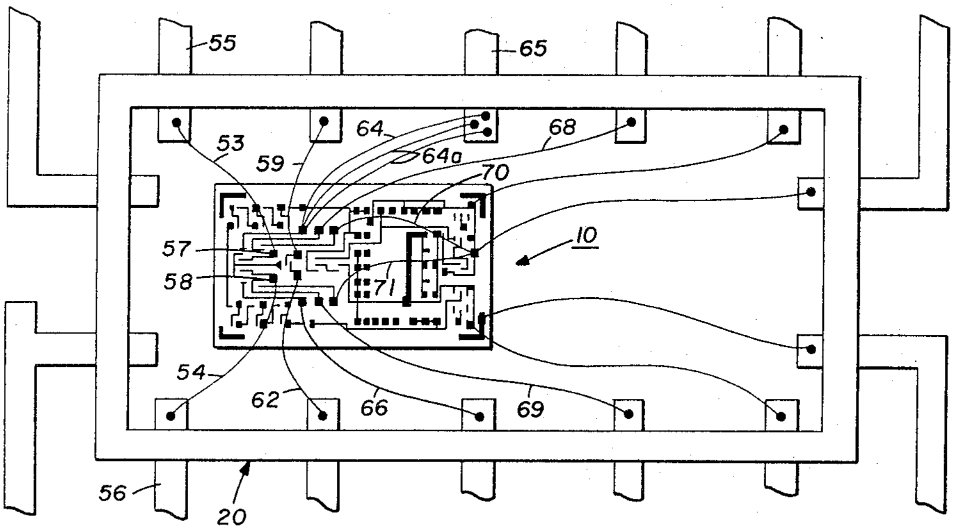
FIGURE 6 is a simplified plan view showing the substrate of FIGURE 1 in a conventional integrated circuit flat pack with the lead pattern and lead wires in place, and also illustrates a manner in which a temperature gradient may be established in accordance with this invention to thermally compensate a mismatched amplifier pair.

As just mentioned, it is desirable to minimize the heat flow through the substrate in the controlled zone occupied by the stabilized components so as to reduce thermal gradients between matched components which may occur due to anomalies in the insulating layer 24. By the same token, it is important that all bonded lead wires extending from the substrate to the metal leads of the flat pack, and therefore from the substrate to the ambient, not establish heat flow in the controlled zone, unless a thermal gradient is specifically desired for purposes which will hereinafter be described. Since the metal lead wires are heat conductors, a sufficient amount of heat will flow through the substrate to the lead wires and thence to the ambient as to establish significant localized temperature gradients within the substrate. For this reason, as can be seen in FIGURE 6, all of the metal film lead conductors for the transistors $T_1$, $T_2$, $T_4$ and $T_5$ extend from the transistors to a point on the substrate between the devices and the heat source. For example, the lead wires 53 and 54 are bonded to flat pack leads 55 and 56 and to expanded contact pads 57 and 58 which extend from the collectors of transistors $T_1$ and $T_2$ and bases of transistors $T_4$ and $T_5$ to a point essentially on opposite sides of transistor $T_3$. Leads 59 and 62 extend to the base and emitter, respectively, of transistor $T_3$. Leads 64 and 66 are the input leads to the bases of transistor $T_1$ and $T_2$. Leads 68 and 69 are connected to the emitters of transistors $T_4$ and $T_5$, and jumper loops 70 and 71 are connected to the collectors of transistors $T_4$ and $T_5$. With the exception of the leads 53 and 54, it will be noted that all leads, which are very small diameter gold wires, are ball bonded to pads disposed between transistor $T_3$ and the heater source $Q_4$, and that even pads 57 and 58 are positioned between transistors $T_4$ and $T_5$ and the heater source $Q_4$. It will also be noted that the expanded pads to which the lead wires are bonded are disposed symmetrically about the axis of symmetry 60. If the lead wires were bonded to the substrate randomly, or on the opposite side of the stabilized components from the heater, then current flowing from the heater through the substrate to the lead wires would cause thermal gradients in the region of the stabilized components, thus adversely affecting stability of the components. However, by placing the ball bonding points between the components to be thermally stabilized and the heater transistor $Q_4$, the heat flowing through the bonded leads does not pass through that portion of the substrate containing the components to be stabilized and accordingly does not establish thermal gradients in that region.

In this regard, it is to be noted that flow of thermal energy through the controlled zone in which the sensitive elements are located can be further reduced by cantilevering that portion of the substrate out into the air within the package by removing the insulating layer 24 between that portion of the substrate and the package. However, this results in a mechanically weak structure which is unsuitable for most applicaitons. If, however, the device is to be used in an environment wherein it will not be subjected to shock and vibration, then such a cantilevered configuration can be utilized, in which case the slope of the heat gradient lines illustrated in FIGURE 5 will be essentially flat over the length of the substrate that is cantilevered, provided of course that no leads or other heat conductors are bonded to the cantilevered portion of the substrate.

As previously noted in FIGURE 5, longitudinally extending thermal gradients of some magnitude exist over substantially the entire length of the substrate 10 when the insulating layer 24 is coextensive with the substrate. If the substrate is symmetrical, the insulation layer 24 is homogeneous, and the lead wires extending from the substrate are disposed symmetrically about the axis 60, then it can be expected that two symmetrically located components will be maintained at substantially the same temperature. Of course it is impossible to fabricate a substrate having a perfectly symmetrical thermal configuration. Further, it is impossible, except by remote chance, to fabricate two transistors with identical base-emitter voltages for all temperatures within a given range. Thus, even if a perfectly symmetrical substrate 10 could be accomplished so as to maintain each transistor pair at precisely the same temperature, a drift will still be inherent in the system as the temperature of the pair changes due to the change in the ambient temperature.

Accordingly, in accordance with an important aspect of the invention, a temperature gradient is purposely established between a component pair, in this case transversely of the substrate 10, so as to introduce a temperature difference or gradient between the pair to compensate for anomalies in the thermal system, or differences in the thermal characteristics of a matched pair of components, or drift due to other components in the circuit. This may be accomplished after the system has been tested by purposely increasing the thermal conductivity from a point on the substrate to the ambient. For example, as shown in FIGURE 6, additional leads 64a may be bonded to the expanded contact on the substrate and to the lead 65 of the package device 20. This increases the thermal conductivity from this point on the substrate to the ambient and thereby lowers the temperature of the substrate at this point, which in turn introduces temperature gradients extending transversely between the matched pair of transistors, thus compensating for differences in the $V_{BE}$ values of the transistors. It will also be appreciated that this type of temperature compensation can also be used to purposely mismatch the $V_{BE}$ tracking in order to compensate for other components in the circuit, which may or may not be on the substrate, or which may or may not be identified by testing the circuit. For example, the curve 72 represents the drift referred to the input of the amplifier system prior to the addition of the leads 64a for a change in ambient temperature from 0° C. to 100° C. A drift of 115 microvolts, as represented by the distance 73, will be noted. After the transverse thermal gradients were introduced to the substrate by addition of the leads 64a, the thermal drift of the amplifier system, referred to the input, is represented by the curve 74. It will be noted that the drift over the same temperature range was reduced to a value of 70 microvolts, as shown by the distance 76. It is important to note that compensation in this manner does not affect the electrical circuit and therefore does not affect common mode rejection, but instead is pure temperature compensation.

Figure 10:
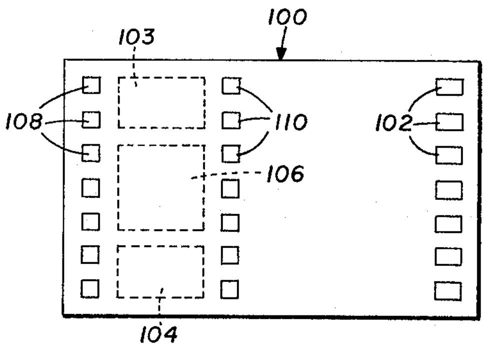
FIGURE 10 is a simplified plan layout of another temperature stabilized substrate fabricated in accordance with the present invention.

Referring now to FIGURE 10, another temperature stabilized substrate constructed in accordance with the present invention is indicated generally by the reference numeral 100. The substrate 100 is shown only in plan view. However, it is to be understood that the substrate 100 is insulated from the ambient as heretofore described in connection with the substrate 10. The substrate 100 is essentially symmetrical about a longitudinally extending axis of symmetry. However, instead of having a single point heat source such as the transistor $Q_4$, a plurality of transistors 102, which would be connected in parallel, are disposed along one end of the substrate 100 so as to provide a line heat source. A number of sensors are located in the sensing regions indicated by the dotted outlines 103 and 104, and the devices to be temperature stabilized are located generally within the controlled zone indicated by the dotted outline 106. A plurality of metallized tabs 108 are disposed in a line along the end of the substrate opposite the end at which the heater is located, and a similar row of contacts 110 are disposed between the line heater source 102 and the sensing and control areas 103, 104 and 106.

In the device 100, considerable flexibility is provided for establishing transverse thermal gradients to thermally compensate for differences in matched components or for other purposes. For example, one or more of the separate heater transistors 102 can be disconnected from the power supply after the circuit has been tested so as to vary the intensity of the heat source along its length to establish a thermal gradient in the substrate. Or metal leads or similar heat conductors may be bonded to one or more of the pads 108 or 110 and extended to the ambient to provide a localized spot of reduced temperature and thereby establish a transverse thermal gradient or other thermal gradient pattern as desired. Of course, it will be appreciated that if desired, metal wires may be bonded to essentially any point on the substrate so as to provide differential thermal gradients and thereby provide temperature compensation of two or more components without affecting the electrical characteristics of the circuit in which the components are incorporated.

Figure 4:
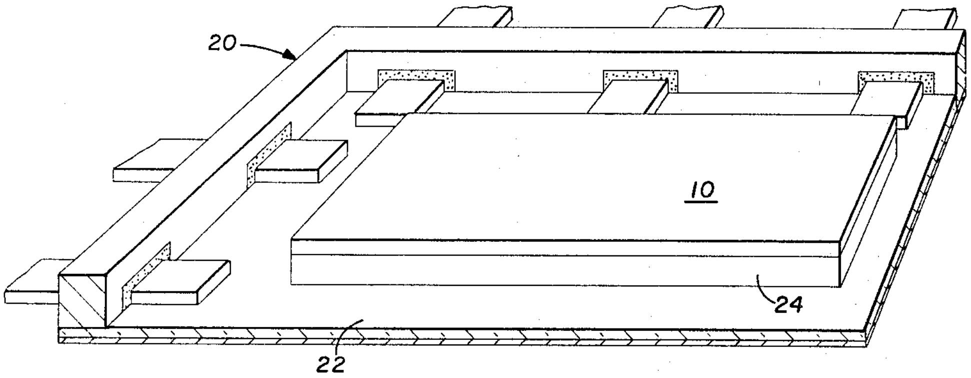
FIGURE 4 is a simplified perspective view of a portion of the package for the substrate of FIGURE 1 illustrating the manner in which the substrate is mounted and insulated from the ambient.
Figure 7:
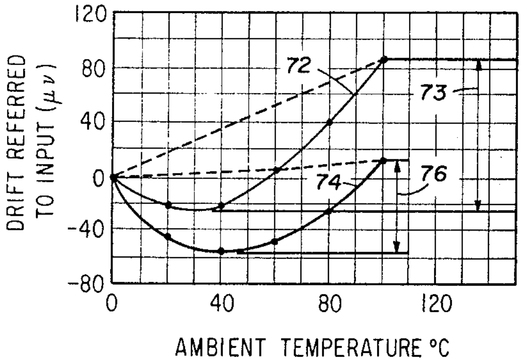
FIGURE 7 is a graph which serves to illustrate the improvement resulting from the thermal compensation illustrated in FIGURE 6.
Figure 8:
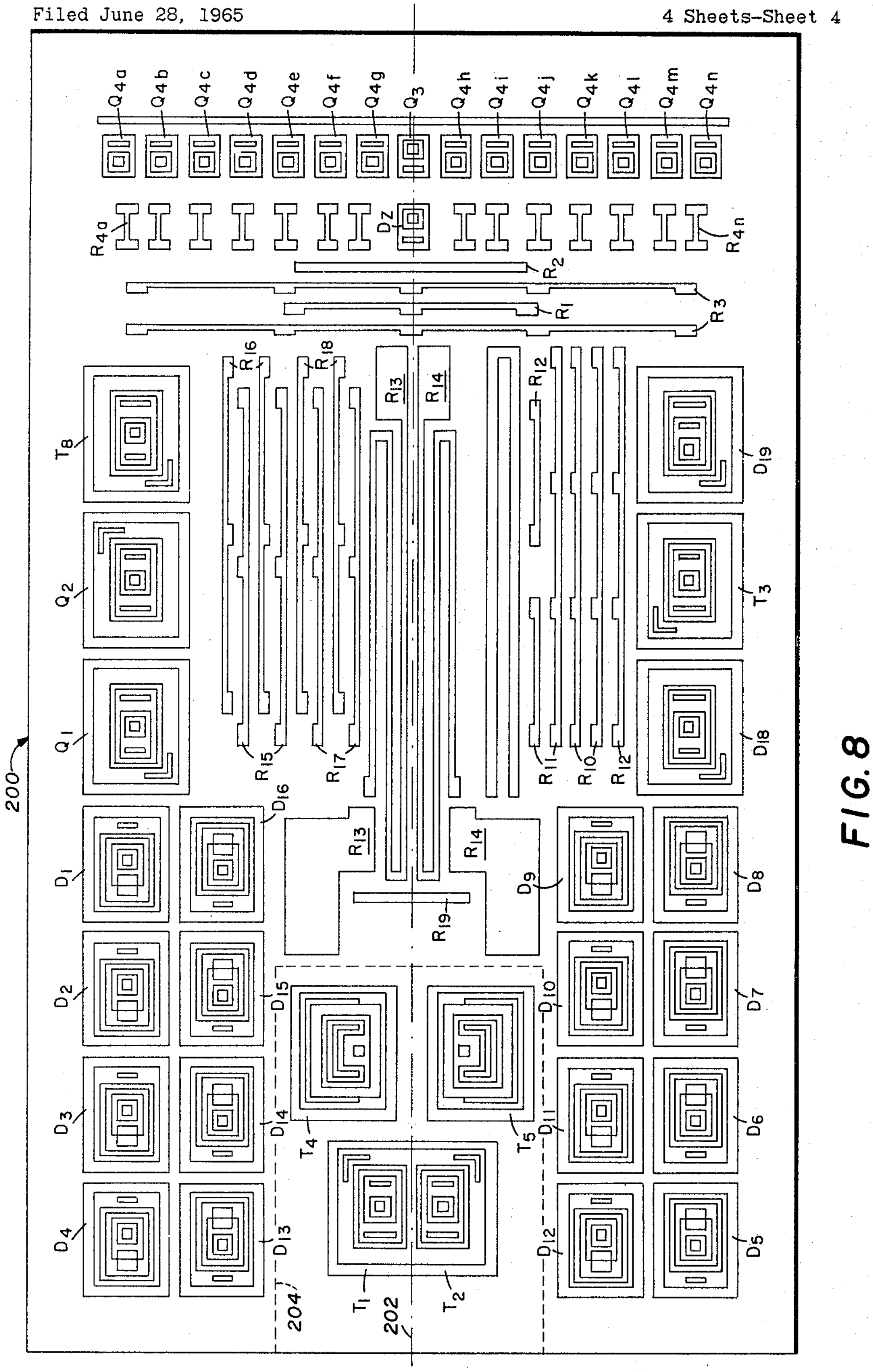
FIGURE 8 is a plan layout of a temperature stabilized differential amplifier fabricated in accordance with another embodiment of the invention.

Referring now to FIGURE 8, another temperature stabilized circuit device constructed in accordance with the present invention is indicated generally by the reference numeral 200. The substrate 200 is similar to the substrates 10 and 100 and is also to be considered as mounted in a conventional flat pack such as illustrated in FIGURES 4 and 6 by means of an insulating layer such as the layer 24, although such a mounting is not specifically illustrated. The substrate 200 includes a complete direct coupled, differential preamplifier as illustrated by the circuit diagram of FIGURE 9 in addition to the amplifier 12 shown in FIGURE 2. However, the thermal amplifier 12 has been modified by the inclusion of two additional diodes $D_{15}$ and $D_{16}$ and also by the use of fourteen transistors $Q_{4a}$ through $Q_{4n}$ and associated resistors $R_{4a}$ through $R_{4n}$, respectively, which are connected in parallel and substituted for the single heater transistor $Q_4$ illustrated in FIGURE 2. All other components in the amplifier 12 are the same and are designated by the corresponding reference characters in the plan layout of FIGURE 8, and the operation of the thermal amplifier is the same except that a line heat source rather than a point heat source is provided.

Figure 9:
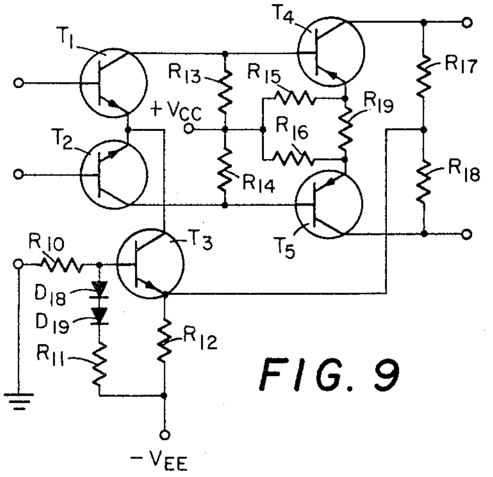
FIGURE 9 is a schematic circuit diagram of the differential amplifier incorporated in the substrate illustrated in FIGURE 8.

The preamplifier circuit illustrated in FIGURE 9 is comprised of a matched pair of input transistors $T_1$ and $T_2$ which are differentially connected and employ a transistor $T_3$ as a constant current source. Associated with the transistor $T_3$ are resistors $R_{20}$, $R_{10}$, $R_{11}$ and $R_{12}$, as well as diodes $D_{18}$ and $D_{19}$ which are in actuality transistors in which the collector base junctions have been shorted and serve to further stabilize the transistor $T_3$. A pair of matched resistors $R_{13}$ and $R_{14}$ connect the collectors of transistors $T_1$ and $T_2$ to the positive collector voltage source $V_{cc}$. A second pair of differentially connected transistors $T_4$ and $T_5$ provide a second amplifying stage, and the bases of the transistors $T_4$ and $T_5$ are accordingly connected to the collectors of the input pair of transistors $T_1$ and $T_2$. The emitters of the transistors $T_4$ and $T_5$ are connected through matched resistors $R_{15}$ and $R_{16}$ to the positive voltage source $V_{cc}$ while the collectors form the outputs of the preamplifier and are also connected through matched resistors $R_{17}$ and $R_{18}$ to the emitter of the constant current transistor $T_3$.

Referring now to FIGURE 8, it will be noted that the transistors $Q_{4a}$–$Q_{4n}$ are located in a line extending transversely of an axis of symmetry 202 and are disposed symmetrically about the axis. Transistor $Q_3$ is disposed in the center of the line of transistor $Q_4$ on the axis of symmetry 202. The Zener diode $D_z$ is located on the axis 202 adjacent transistor $Q_3$. Individual resistors $R_{4a}$–$R_{4n}$ interconnect the emitters of each of the transistors $Q_{4a}$–$Q_{4n}$, respectively, to ground and are located in a symmetrical line disposed transversely of the axis 202. The remaining resistors in the thermal amplifier 12 extend transversely of and are symmetrical about the axis 202, as will be seen by noting resistors $R_1$, $R_2$ and $R_3$. It will also be noted that resistor $R_3$ is formed by two parts located on opposite sides of resistor $R_1$ and interconnected by a metal film conductor deposited on the surface of the substrate. Transistors $Q_1$ and $Q_2$ together with a spare transistor $T_8$ are counterbalanced by transistor $T_3$ and diodes $D_{18}$ and $D_{19}$ from the preamplifier circuit. Sensing diodes $D_1$–$D_{16}$ are arrayed symmetrically about the axis 202. The input transistors $T_1$ and $T_2$ are located in very close proximity and are disposed symmetrically about the axis 202 as well as adjacent to the end of the substrate 200. The second stage transistor pair $T_4$ and $T_5$ are located symmetrically about the axis 202 and adjacent to the input pairs. The most important resistor pair $R_{13}$ and $R_{14}$ extend parallel to and are disposed symmetrically about the axis 202, and are positioned in close proximity so as to have essentially the same temperature at corresponding points. Resistor pairs $R_{15}$ and $R_{16}$ are interlaced in order to be placed in closer proximity as are the resistor pair $R_{17}$ and $R_{18}$, with the parts of each resistor interconnected by surface deposited metal films. The resistors $R_{10}$, $R_{11}$, and $R_{12}$ associated with the constant current source transistor $T_3$ are disposed in close proximity adjacent to the transistor $T_3$. The orientation of the diodes $D_{19}$ and $D_{19}$ on opposite sides of transistor $T_3$ average out the temperature gradient associated with transistor $T_3$ so as to provide additional temperature compensation.

From the layout of FIGURE 8, it will be evident that the various components of the device 200 have been laid out in accordance with the principles heretofore described wherein the overall or average temperature in a control region 204 is maintained with a predetermined temperature range over a predetermined ambient temperature range while the temperature gradient pattern within the substrate is controlled by making the substrate and heat source symmetrical, as well as the sensing means. Heat is generated along a line source disposed normal to and symmetrically about the axis 202. The arrangement of the various components is such as to maintain the symmetry of the substrate. Although the leads are not illustrated, it is to be understood that they would also be symmetrically arranged and that no lead wires would extend from the substrate adjacent the temperature stabilized end, unless a compensating gradient is to be established, so as to minimize thermal gradients longitudinally of the substrate. The sensing diodes are disposed concentrically about the stabilized area so as to provide a broad range of temperature sampling and averaging. The input pair of transistors $T_1$ and $T_2$ are located in very close proximity and near the end of the bar at a point of minimum heat flow so as to minimize the possibility and effect of transverse thermal gradients as a result of anomalies of the underlying insulating areas. The matched pair of transistors $T_4$ and $T_5$ which comprise the less sensitive second stage of the amplifier are placed next to the input pair. Transverse thermal gradients can be purposely established in order to provide further tuning or temperature compensation of the pairs either by disconnecting one or more of the transistors $Q_{4a}$–$Q_{4n}$, or by bonding a lead wire to an approximately selected point on the substrate and to the ambient.

Figure 11:
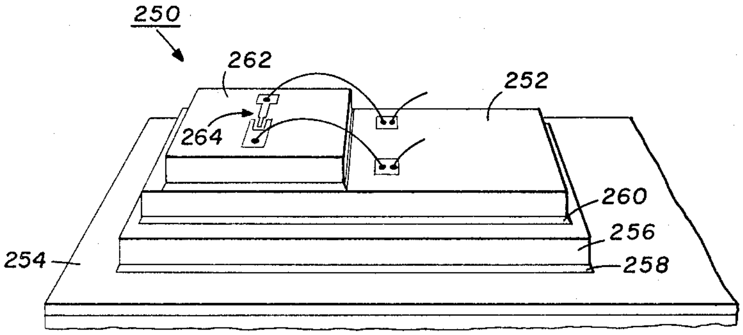
FIGURE 11 is a simplified perspective view of a temperature stabilized reference diode or the like fabricated in accordance with this invention.

Referring now to FIGURE 11, another embodiment of the invention is indicated generally by the reference numeral 250. The device 250 employs a temperature stabilized substrate 252 which is mounted in the bottom 254 of a suitable packaging device by means of a slice of insulating material 256 such as foam glass. The foam glass 256 may be bonded to the bottom 254 by a layer of glass 258, or other adhesive, and the substrate 252 can be bonded to the insulating layer by another glass layer 260. The substrate 252 may be either the substrate 10 or the substrate 200, or may comprise a specially fabricated substrate utilizing only the components required to make up the amplifier 12. If either substrate 10 or substrate 200 is used, the matched pairs of transistors would not be used and these components would not affect the operation of the device. A semiconductor chip 262 is bonded to the top surface of the substrate 252 over the end of the substrate which contains the sensing diodes and opposite the end where the heater is located. The chip 262 may contain any number of semiconductor devices the temperature of which it is desired to stabilize, such as for example, a single reference diode 264 as illustrated, or a pair of matched transistors as heretofore described. The diode 264 is preferably located precisely over the point on the substrate 252 which is maintained at a constant temperature. Of course, all leads from the substrate 252 would have to be taken from the exposed surface of the substrate to the ambient. However, it is important, unless a temperature gradient in the chip 262 is specifically desired for compensation purposes, that all lead wires bonded to the chip 262 extend first to the substrate 252, then to the packaging device and ambient, rather than directly to the packaging device. Otherwise, heat would tend to flow from the substrate 252 through the chip 262 and through the lead wires to the ambient and thereby establish temperature gradients in the chip 262 which would not necessarily be reflected by the sensing diodes on the substrate 252. Of course, it is possible to establish controlled temperature gradients for temperature compensation if a matched pair of devices are positioned on the chip 262, in which case this might be accomplished by appropriately placed wires interconnecting the chip and the ambient heat sink. The chip 262 constitutes, generally, a cantilevered or pyramidal configuration. Because of the absence of significant heat flow through the chip in the vertical direction, i.e., the direction normal to the plate 254, the chip tends to remain at a uniform temperature over its vertical height. Therefore, the top surface of the chip 262, at which any semiconductor components are essentially located, tends to be free from temperature gradients, resulting in an ideal environment for paired components, such as transistors, as well as for single components such as a reference diode. Otherwise the operation of the embodiment 250 is substantially the same as that of the embodiments heretofore described.

As previously mentioned, the feedback in the amplifier 12 in both substrates 10 and 200 is primarily negative. However, since there is a finite time delay associated with heat flow from the heater transistor $Q_4$ to the sensing diodes $D_1$–$D_{14}$, the feedback may also be positive so that if certain requirements as to gain and feedback ratio are satisfied, the amplifier will be unstable and will oscillate. The time delay between a change in the heating effect at transistor $Q_4$ and its detection by the sensing diodes can be considered as analogous to the diodes detecting the phase shift and attenuation of a thermal wave propagating from the heater transistor $Q_4$. Such an analysis is identical to considering an electrical transmission line from the phase shift point of view. When considered in terms of phase shift, thermal oscillation would theoretically result when the phase of the thermal wave is shifted by 180°, provided the electrical gain of the feedback portion of the amplifier overcomes all thermal losses.

In accordance with an important aspects of the invention, one or more of the sensing diode junctions are placed in very close proximity to the heater to act as an anticipator and prevent oscillation. More specifically, the Zener diode $D_z$ is placed in close proximity to the heater in both the substrate 10 and the substrate 200. As a result, the contribution of the Zener diode to the phase vector sum of all sensing diodes will be of substantial magnitude due to the fact that the heat is not attenuated significantly at the Zener diode and due to the fact that the reverse voltage across the diode changes to a greater extent than forward biased diodes with temperature changes, and will have a phase angle close to 45° since the effective heater temperature lags the heater power by 45° in the frequency range where excess phase is being produced along the substrate. This large phase vector close to the 45° phase angle insures that the sensing vector at the 180° phase angle will not reach a value such as to cause oscillation of the amplifier, except when the gain in the electrical loop is very high. This permits the use of a much higher gain electrical amplifier in the feedback loop, thereby increasing the temperature stability of the control region.

Although several preferred embodiments of the invention have been described in detail, it is to be understood that various changes, substitutions and alterations can be made therein without departing from the spirit and scope of the invention as defined by the appended claims.

What is claimed is:

1. In a temperature stabilized semiconductor device, the combination of:
   - a solid substrate,
   - a temperature control region on said substrate,
   - thermal insulation means for thermally insulating the substrate from the ambient,
   - heater means on the substrate for adding heat to the substrate in response to current passed through the heater means, a plurality of sensor means on the substrate, the sensor means being arrayed to sense the average temperature in (a) said temperature control region on the substrate for the disposition of a semiconductor device the temperature of which is to be stabilized, and circuit means interconnecting the sensing means and the heater means for increasing the current through the heater means as the temperature of the substrate decreases in the control region and for decreasing the current through the heater means as the temperature of the substrate in the control region increases so as to maintain the temperature of the control region substantially constant.

2. The combination defined in claim 1 wherein:

the heater means is a PN junction in a transistor the collector-emitter circuit of which is adapted to be connected across a voltage supply, and the circuit means comprises; a voltage network which includes the sensor means for connection across a voltage supply, and an amplifier circuit means for connection across a voltage supply, the input of the amplifier circuit means being the change in voltage drop across the sensor means as a result of changes in temperature of the sensor means and the output of the amplifier circuit means being connected to the base of the heater transistor.

3. The combination defined in claim 1 wherein:

the substrate is substantially symmetrical about an axis of symmetry, the thermal insulation means is substantially symmetrical about the axis of symmetry, and the sensing means are located symmetrically about the axis of symmetry.

4. The combination defined in claim 1 further characterized by a semiconductor device for use in an electronic circuit thermally coupled by a high conductance thermal path to the control region so as to be at essentially the same temperature as the control region.

5. The combination defined in claim 4 wherein the semiconductor device is formed in the substrate within the control region.

6. The combination defined in claim 4 wherein the substrate is disposed in a package and a plurality of lead wires extend from the substrate through the package to the ambient, the lead wires extending from points disposed symmetrically about the axis of symmetry and having substantially symmetrical thermal conductance characteristics.

7. The combination defined in claim 5 wherein the substrate is disposed in a package and a plurality of lead wires extend from the substrate through the package to the ambient, said lead wires extending from the substrate between the control region and the heater means so as not to create additional heat flow in the control zone.

8. The combination defined in claim 1 further characterized by a semiconductor device formed in a semiconductor body and bonded to the control region of the substrate by a thermally conductive material.

9. The combination defined in claim 8 further characterized by electrical lead wires to the semiconductor device extending from the semiconductor body to the substrate at a point between the control region and the heater means, then to the ambient.

10. The combination defined in claim 1 further characterized by a pair of matched semiconductor components on the substrate within the control region, the pair of components being located in the control region and disposed symmetrically about an axis extending from the center of the heater means through the effective center of sensing of the sensor means.

11. The combination defined in claim 10 further characterized in that all lead wires extending from semiconductor components on the substrate to the ambient are bonded to the substrate at points between the control region and the heater means.

12. The combination defined in claim 11 wherein there are a plurality of lead wires which extend from points spaced symmertically about the axis.

13. The combination defined in claim 12 further characterized by thermal conductor means connected to the substrate at an asymmetrical point with respect to the axis and extending to the ambient for establishing a thermal gradient between the components and thereby compensate for differences in the temperature variable characteristics of the circuit of which the components are a part.

14. The combination defined in claim 1 further characterized in that one of the sensor means is disposed adjacent the heater means to act as an anticipator and prevent oscillation of the heater means as a result of the thermal feedback to the sensor means.

15. A temperature stabilized semiconductor device comprising:

an elongated solid substrate having an axis of symmetry, thermal insulation means disposed around and supporting the substrate for thermally insulating the substrate from the ambient, the thermal insulating means being thermally symmetrical about the axis of symmetry of the substrate, and control means disposed on the substrate for maintaining a control region disposed adjacent one end of the substrate and symmetrical to the axis of symmetry at a temperature within a predetermined range for a predetermined range of ambient temperatures by the addition of heat to the other end of the substrate symmetrically about the axis of symmetry, the control means including a plurality of temperature sensing means formed on the substrate at points disposed along opposite sides of the control region, a heater transistor formed on the substrate and disposed symmetrically about the axis at the other end, and a plurality of resistors formed on the substrate, the resistors being symmetrical about the axis and extending transversely across the axis between the control region and the heater transistor, metallized film conductors on the substrate interconnecting the components of the control means, and metal lead wires extending from the substrate at points spaced from the control region end of the substrate to the ambient for supplying electrical power to the control means.

16. The semiconductor device defined in claim 15 further characterized by a sensing diode junction disposed adjacent to the heater transistor to act as an anticipator and prevent oscillation of the control means due to thermal feedback from the heater transistor to the sensing diode.

17. The semiconductor device defined in claim 15 further characterized by:

a direct coupled, differential amplifier having a matched pair of input transistors differentially connected, a matched pair of output transistors differentially connected, and matched pairs of biasing resistors for the transistors pairs all formed on the substrate, the input transistor pair being located symmetrically about the axis of symmetry and in close proximity within the control region, the output transistor pair being located symmetrically about the axis of symmetry and in close proximity within the control region, each matched pair of resistors being located in close proximity and extending parallel to the axis of symmetry, and electrical leads to the differential amplifier comprised of metallized strips extending from the control region toward the heater transistor and lead wires extending from points between the control region and the heater transistor to the ambient, the electrical leads being thermally symmetrical with respect to the axis of symmetry.

18. The semiconductor device defined in claim 17 further characterized by:

asymmetrically disposed thermal conductor means connected to the substrate and extending to the ambient to establish thermal gradients between two or more matched components in the control region as a result of nonsymmetrical heat flow through the substrate whereby differences in the temperature characteristics of the matched pair of components or of other components in the circuit will be compensated.

19. The semiconductor device defined in claim 17 wherein there are a plurality of transistor heaters arrayed transversely of any symmetrically about the axis of symmetry to provide a symmetrical line source of heat.

20. The semiconductor device defined in claim 19 wherein one or more of the transistor heaters are disconnected from the circuit to provide an asymmetrical line source of heat and establish a temperature gradient between a matched pair of components disposed in the control region and thereby compensate for differences in the temperature characteristics the circuit of which the components are a part.

References Cited

UNITED STATES PATENTS 3,308,271 3/1967 Hilbiber ----------- 219—501

ROY LAKE, *Primary Examiner.*

J. B. MULLINS, *Assistant Examiner.*